(12) United States Patent
Chan et al.

(10) Patent No.: US 6,518,620 B2
(45) Date of Patent: *Feb. 11, 2003

(54) EEPROM MEMORY CELL WITH INCREASED DIELECTRIC INTEGRITY

(75) Inventors: Tsiu Chiu Chan, Carrollton, TX (US); Pervez H. Sagarwala, Grand Prairie, TX (US); Loi Nguyen, Carrollton, TX (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 72 days.

(21) Appl. No.: 09/195,089

(22) Filed: Nov. 18, 1998

(65) Prior Publication Data

US 2001/0022377 A1 Sep. 20, 2001

Related U.S. Application Data

(62) Division of application No. 08/903,608, filed on Jul. 31, 1997, now Pat. No. 5,885,871.

(51) Int. Cl.$^7$ ............................................. H01L 29/788
(52) U.S. Cl. ...................... 257/321; 438/263; 438/594
(58) Field of Search ....................... 257/321; 438/263, 438/264, 594

(56) References Cited

U.S. PATENT DOCUMENTS

| | | | | |
|---|---|---|---|---|
| 4,640,844 A | * | 2/1987 | Neppl et al. ................ | 438/242 |
| 4,672,580 A | * | 6/1987 | Yau et al. .................... | 365/189 |
| 4,807,003 A | * | 2/1989 | Mohammadi et al. ...... | 257/318 |
| 4,823,316 A | * | 4/1989 | Riva ........................... | 257/321 |
| 4,935,790 A | * | 6/1990 | Cappelletti et al. ......... | 257/321 |
| 5,404,037 A | * | 4/1995 | Manley ....................... | 257/321 |
| 5,620,913 A | * | 4/1997 | Lee ............................. | 438/264 |
| 5,837,584 A | * | 11/1998 | Lu et al. ..................... | 438/263 |

FOREIGN PATENT DOCUMENTS

JP 06-163916 * 6/1994 ................. 257/321

OTHER PUBLICATIONS

Wellekens, D. et al., "Single Poly Cell as the Best Choice for Radiation–Hard Floating Gate EEPROM Technology", IEEE Trans. Nuclear Science, Dec. 1993, vol. 40, No. 6, pp. 1619–1627.*

* cited by examiner

*Primary Examiner*—Olik Chaudhuri
*Assistant Examiner*—Howard Weiss
(74) *Attorney, Agent, or Firm*—Lisa K. Jorgenson; Peter J. Thoma

(57) ABSTRACT

A memory cell for an EEPROM memory is fabricated to provide increased oxide thickness at the edge of the tunnel oxide and under the edges of the polysilicon capacitor plate in order to improve the dielectric integrity of the capacitor structure. In one embodiment using a silicided polysilicon process, the oxide is made thicker at the edge of the tunnel oxide by reoxidizing the silicon at the corner of the polysilicon capacitor plate and the underlying substrate surface by exposing the device to a short duration oxidation step after having deposited a 200 Å to 500 Å thick porous oxide over the device to protect the silicide from excessive exposure to the oxidizing ambient. In another embodiment the tunnel oxide is grown in a window in the gate oxide layer, which is about four times thicker than the tunnel oxide, so that the gate oxide completely surrounds the tunnel oxide, and the polysilicon capacitor plate extends beyond the edge of the tunnel oxide terminating at a point above the gate oxide.

10 Claims, 6 Drawing Sheets

US 6,518,620 B2

1

EEPROM MEMORY CELL WITH INCREASED DIELECTRIC INTEGRITY

CROSS REFERENCE TO RELATED APPLICATION

This application is a division of application Ser. No. 08/903,608, filed on Jul. 31, 1997, now U.S. Pat. No. 5,885,871.

BACKGROUND OF THE INVENTION

The present invention is directed to processes for fabricating MOS devices with ultrathin oxide layers, and particularly to EEPROM fabrication methods and structures.

Electrically Erasable Programmable Read Only Memories (EEPROMs) are nonvolatile memory devices that employ floating gates to store bits of data in individual cells. At each memory cell location, an ultrathin oxide layer called the "tunnel oxide" separates a floating gate from an underlying substrate. To program a memory cell, a voltage exceeding the normal operating voltage is applied to a control gate, which is capacitively coupled to the floating gate, to cause electrons to tunnel from the substrate through the tunnel oxide onto the floating gate in accordance with the well known Fowler-Nordheim principle. Electron tunneling occurs in the presence of a very high electric field applied to the tunnel oxide. Because the tunnel oxide is very thin and experiences such a high electric field, its dielectric integrity is an important design consideration.

An example of an early EEPROM memory cell is described in U.S. Pat. No. 4,203,158, in which a stacked-gate arrangement is employed to facilitate fabrication of a high density integrated circuit (IC) memory. Two layers of polycrystalline silicon ("polysilicon") are used to fabricate the stacked gates. In each memory cell, a first-level polysilicon layer defines the floating gate and a second-level polysilicon layer defines the control gate. An equivalent circuit for one such memory cell is shown in FIG. 1 herein, and is indicated generally by reference numeral 10.

The memory cell 10 of FIG. 1 communicates its stored bit of data to the outside world through a column bit line 12. A series connection of a select transistor 14 and a floating-gate transistor 16 is provided between the bit line 12 and a voltage source or ground line 18. The drain D of select transistor 14 is connected to the bit line 12. The source S of transistor 14 is connected to the drain D of floating-gate transistor 16. The source S of transistor 16 is connected to the source line 18. Transistor 14 has its gate 20 controlled by a row select or "word" line 22. Transistor 16 includes a floating gate 24 and a control gate 26. A program select line 28 is connected to the control gate 26.

To store a first binary logic level in the cell 10, a high programming voltage (e.g., +20 volts) is applied to the word line 22 and to the program line 28, while the bit line 12 and source line 18 are held at ground. By virtue of capacitive coupling, a sufficiently high voltage appears on the floating gate 24 to cause electrons to tunnel from the drain D of transistor 16 to the floating gate 24, putting it in a negatively charged state. This causes transistor 16 to have a threshold voltage that is high enough to keep it off during a read operation. To store a second binary logic level in the memory cell 10, the program line 28 is grounded while the high programming voltage is applied to the bit line 12 and to the word line 22 with the source line 18 left floating. This causes electrons to tunnel from the floating gate 24 to the drain D of transistor 16, discharging the floating gate 24 and perhaps leaving it with a slight net positive charge. In this

2 state, transistor 16 will have a threshold voltage such that it will be on during a read operation. As those skilled in the art will appreciate, reading is accomplished by applying a normal operating voltage (e.g., +5 volts) to the word line 22 and to the program line 28, then detecting whether transistor 16 is on or off.

EEPROM memories can be manufactured as discrete integrated circuit devices or as components of more complex integrated circuit devices. When the EEPROM memory is included as a relatively small part of a more complex integrated circuit device, the allocation of chip area for each individual memory cell is not as critical as for high-density discrete EEPROMs. Therefore, when the EEPROM is part of a more complex integrated circuit device, it can be laid out using a single polysilicon layer rather than the stacked two-layer arrangement of the aforementioned patent. The slight additional area devoted to such a single-layer implementation does not appreciably effect the size of the integrated circuit device since its other circuitry occupies most of the chip area. The simplification of the fabrication process by resorting to single-layer polysilicon technology more than compensates for the slight additional chip area occupied by the EEPROM portion of the device.

A prior art layout for one EEPROM memory cell using single-layer polysilicon technology is illustrated in FIG. 2, wherein the memory cell is indicated generally by reference numeral 100. A cross section through a portion of the memory cell 100 is illustrated in FIG. 3. The cross section is taken through a floating-gate transistor 102 and a tunneling capacitor 104. FIG. 4 is an enlarged view of a portion of FIG. 3 at one edge of the tunneling capacitor 104.

With particular reference to FIG. 3, the device is fabricated on a P(−) substrate 106. One of many, active areas of the device is shown defined within a thick field oxide 108, typically formed by a conventional LOCOS (local oxidation of silicon) process. The active area is selectively doped with N-type impurities to create transistor regions and a capacitor plate. In particular, a relatively deep N-type region 110 defines a lower capacitor plate of the tunneling capacitor 104. The junction depth of region 110 is typically 0.4 microns. An adjoining N-type region 112 at an intermediate depth (e.g., about 0.2 microns) defines the drain of floating-gate transistor 102. Another intermediate depth N-type region 114 defines the source of floating-gate transistor 102. Shallow N-type extensions 116 are formed by conventional lightly doped drain ("LDD") processing, and define the channel 118 of transistor 102 therebetween. The floating-gate transistor 102 has a structure above the substrate 106 that includes a thin gate oxide 120, a gate 122 and sidewall oxide spacers 124. Similarly, the tunneling capacitor 104 has a structure above the substrate 106 that includes an ultrathin tunnel oxide 126, an upper capacitor plate 128, and sidewall oxide spacers 130. Overlying and passivating the entire structure is a composite reflowed glass layer 132, typically having an undoped $SiO_2$ lower portion and a doped $SiO_2$ upper portion (which are not separately delineated in the drawing).

Referring specifically to FIG. 4, the upper capacitor plate 128 includes a lower N-type polysilicon layer 134 and an upper tantalum silicide ($TaSi_2$) layer 136. The $TaSi_2$ layer is formed by a conventional deposition technique, and is provided in order to increase the conductivity of the conductive lines used in the device. The gates of the various transistors of the integrated circuit device have the same tantalum silicide/polysilicon structure. Silicides using refractory metals other than tantalum are known in the art, including, e.g., titanium, molybedinum and tungsten. The use of a silicide of a refractory metal atop a polysilicon layer is hereinafter referred to as "silicided polysilicon". The thicknesses of the various layers are not drawn to scale but generally depict the shapes and positions of the elements of the structure. The tunnel oxide 126 is ultrathin, typically being only about 65 Å to 70 Å thick. The silicided polysilicon layer 128 is typically about 3500 Å thick, with its component layers 134 and 136 being about 2000 Å and 1500 Å, thick respectively. The thickness of glass layer 132 is typically about 8000 Å.

Referring again to FIG. 2, a first silicided polysilicon layer includes a relatively large rectangular portion 140 and narrow fingers 142 and 144, which extend from the large portion 140. The relatively large rectangular portion 140 overlies an active area 146 that is entirely doped N-type. The doped active area 146 serves as the program line for the memory cell 100 and similar memory cells (not shown) in the same row. The portion of program line 146 below the large rectangular portion 140 of the first silicided polysilicon layer serves as a control gate of the floating-gate transistor 102. The finger 142 defines the floating gate of floating-gate transistor 102. The finger 144 defines the upper capacitor plate of the tunneling capacitor 104. It will be appreciated that silicided polysilicon portion 140 and the underlying portion of program line 146 together with the oxide layer therebetween define a biasing capacitor 148 that is connected in series with the tunneling capacitor 104 to enable a voltage to be applied to the tunneling capacitor sufficient to cause electron tunneling during programming of the memory cell 100.

Another active area 150 includes three separate N-type doped regions 152, 154 and 156. The locations of the N-type regions in FIG. 2 are indicated by the shading. Region 152 corresponds to source region 114 and the adjoining LDD region 116 of FIG. 3. Region 154 corresponds to capacitor plate region 110, drain region 112 and the adjoining LDD region 116 of FIG. 3.

With further reference to FIG. 2, a second silicided polysilicon layer 158 overlies N-type region 152 and defines a select transistor 160 where it crosses active area 150 between N-type regions 154 and 156. The polysilicon layer 158 defines a word line for a row of memory cells. A first metal line 162, which is shown broken away, runs through the memory cell 100 and similar memory cells (not shown) in the same column to provide a voltage source to the column of memory cells. Metal line 162 is normally at ground potential but can be disconnected from ground when required during programming. Connection between the metal source line 162 and an extension 164 of N-type region 152 is made at a contact site 166. A second metal line 168, which is also shown broken away, runs through the memory cell 100 and similar memory cells in the same column, and serves as a bit line for such column of memory cells. Connection between the metal bit line 168 and the N-type region 156 is made at contact site 170.

FIG. 5 illustrates a circuit diagram for the memory cell 100 with the circuit elements and conductive lines arranged in approximately the same locations as for the physical layout of FIG. 2, using the same reference numerals where applicable to designate the corresponding parts. The circuit operates by charging and discharging the floating gate 142 to program the logic state of the memory cell 100 in a manner similar to the operation of the memory cell 10 of FIG. 1.

Referring to FIGS. 2 and 5, a relatively high programming voltage (in this case about +14 volts) is applied to word line 158 and program line 146, while bit line 168 and source line 162 are held at ground. Approximately ⅔ of the high programming voltage appears by capacitive coupling across the tunneling capacitor 104, causing electrons to tunnel from its lower plate (i.e., region 154) to its upper plate (i.e., the finger 144). Of course, this causes the entire silicided polysilicon layer 140/142/144 to become negatively charged so that floating-gate transistor 102 will stay off during a read operation. To reverse the charge on the tunneling capacitor 104, the program line 146 is grounded while the high programming voltage is applied to the bit line 168 and to the word line 158 with the source line 162 left floating. Reading is accomplished by applying a normal operating voltage (e.g., +5 volts) to the word line 158 (to turn on transistor 160) and to the program line 146, then detecting whether transistor 102 is on or off by conventional sensing circuitry (not shown) at one end of the bit line 168.

Referring again to FIG. 4, it will be appreciated that the ultrathin tunnel oxide 126 experiences a very high electric field in the programming mode. Only about 70 Å of oxide are used to support about 10 volts in either direction. With almost 10 volts on the upper capacitor plate 128, electrons will tunnel through oxide layer 126 from the lower capacitor plate 110, which is held at ground potential. The high electric field needed for programming threatens to cause dielectric breakdown through the tunnel oxide 126 at its weakest point. The dashed line 176 at the edge of the tunnel oxide 126 may be vulnerable to dielectric breakdown and a short circuit failure at that point. The dashed line 176 represents the interface between thermally grown oxide layer 126 and a deposited oxide layer that is used to form the sidewall oxide spacer 130. Furthermore, the lower pointed corner 178 of the upper capacitor plate 128 gives rise to a high electric field concentration at that point. This high electric field concentration occurs precisely where the dielectric integrity of the oxide is vulnerable, i.e., at the interface 176.

The coincidence of the vulnerable interface 176 and the pointed corner 178 occurs due to the conventional processing steps employed. Referring again to FIGS. 2 and 3, the field oxide 108 is formed to define the active areas. This is followed by a moderate dose N-type ion implantation using a conventional mask to selectively dope the active area 146 entirely, as well as the portions of the active area 150 at the site of the tunneling capacitor 104 (i.e., forming region 110 in FIG. 3) and a portion of region 152 where the word line 158 will lie across it when subsequently formed. Then the oxide layer that will subsequently define the gate oxide of transistors 102 and 160 is grown in the active areas 146 and 150 to a thickness of about 250 Å. In active area 146 this oxide layer will form the dielectric of the biasing capacitor 148, which is defined by the large rectangular silicided polysilicon portion 140 and the underlying portion of active area 146.

At this point, the tunnel oxide 126 is formed. It has been the practice to etch out a rectangular opening as indicated by the dashed box 180 in FIG. 2 using a conventional photoresist mask. Then, after the etch step and photoresist removal, a thermal oxide layer is grown to a thickness of about 65 Å to 70 Å in the area within the box 180. During such oxidation step, the gate oxide of transistors 102 and 160 and dielectric oxide of biasing capacitor 148 increase in thickness to about 260 Å, i.e., about four times the tunnel oxide thickness, which is a factor in determining the relative capacitances of the biasing capacitor 148 and the tunneling capacitor 104.

A sequence of conventional processing steps follows in which the aforementioned silicided polysilicon layers are formed. The fabrication continues with LDD ion implantation, sidewall oxide formation, and source/drain ion implantation. Referring to FIG. 4, the delineation of the silicided polysilicon pattern includes an anisotropic etch that produces both the pointed corner 178 of the polysilicon layer 134 and the vertical edge 176 of the tunnel oxide layer 126. It will be appreciated that the interface 176 between oxide layers 126 and 130 is relatively vulnerable to dielectric breakdown.

It has been understood for two decades that undercut gates caused by isotropic etching (i.e., "wet etching") techniques could be filled in at the site of the undercut to improve dielectric integrity by resorting to a reoxidation step at an intermediate stage of the process. This technique is described in U.S. Pat. No. 4,553,314, which was highly successful in eliminating gate-shorting problems caused by undercut gates. However, as process technology evolved, reoxidation became less critical in importance and in some cases became impractical. As anisotropic etching (or "dry etching") techniques were introduced into standard fabrication processes, gate undercutting was substantially eliminated as a source of yield and reliability problems. The further introduction of various metal silicide formation techniques provided an impediment to use of reoxidation. Process irregularities can occur when the silicon in the silicide layer reacts with oxygen at the high temperatures used in conventional thermal oxidation procedures.

Due to such problems, reoxidation has been difficult to implement in processes that employ metal silicide/polysilicon layers. The use of the refractory metals tantalum, titanium, molybedinum and tungsten in making metal silicides is known in the art. See, e.g., U.S. Pat. No. 4,505,027. Tantalum disilicide ($TaSi_2$) is a common metal silicide used together with an underlying polysilicon layer to fabricate gate structures in conventional complementary metal-oxide-semiconductor (CMOS) devices. See, e.g., U.S. Pat. No. 4,640,844. In order to successfully implement reoxidation following tantalum silicide layer formation, silicon in excess of the tantalum disilicide stoichiometry must be provided in the silicide layer. See U.S. Pat. No. 4,505,027, Column 4, lines 49–54.

Experiments have shown that the process requires extremely tight control of Si to Ta ratio in the composition of the tantalum silicide layer. It has been found that the Si to Ta ratio must be maintained in the range from 2.45 to 2.50. The tantalum silicide layer is a composition of $TaSi_2$ and elemental Si microcrystals. When the ratio of Si to Ta is maintained below 2.45, the reoxidation step will cause silicon from the polysilicon layer to be pulled up into the tantalum silicide layer as available silicon in the tantalum silicon layer reacts to form $SiO_2$. This causes a "ditching" phenomenon at random locations in the polysilicon layer, resulting in certain transistors exhibiting increased threshold voltages to the point of being operationally nonfunctional. When the ratio of Si to Ta is maintained above 2.50, the reoxidation step causes nodules or "whiskers" of primarily silicon to extrude out of the tantalum silicide, in some cases contacting the substrate surface and creating a short circuit. However, by maintaining the Si to Ta ratio in the extremely tight range of from 2.45 to 2.50 and by holding the reoxidation step to a very short duration, it is possible to obtain functional devices. Nonetheless, the tight tolerances required are difficult to implement consistently so that acceptable yields can be achieved.

SUMMARY OF THE INVENTION

In accordance with a primary object of the present invention, an oxide layer of increased thickness is provided between the outer edge of a silicided polysilicon layer and an underlying substrate to improve the dielectric integrity of a semiconductor device that employs ultrathin oxide insulating layers at various locations in the device.

In accordance with another object of the invention, a pointed corner of a silicided polysilicon layer is oxidized through a porous deposited oxide layer that protects the silicide from exposure to the oxidizing ambient, thereby producing a structure with reduced electric field concentration at the polysilicon corner and preventing dielectric breakdown in an underlying ultrathin oxide layer during operation of the device.

In accordance with another object of the invention, a nonvolatile memory cell is constructed having an ultrathin tunnel oxide layer surrounded by a thicker oxide layer that provides an annular shelf for a capacitor plate of a tunneling capacitor of the memory cell, thereby producing a structure with reduced electric field concentration in the tunnel oxide during operation of the device.

BRIEF DESCRIPTION OF THE DRAWINGS

For a more complete understanding of the present invention and the advantages thereof, reference is now made to the following description taken in conjunction with the accompanying drawings in which.

DESCRIPTION OF THE PREFERRED EMBODIMENTS

Figure 6:
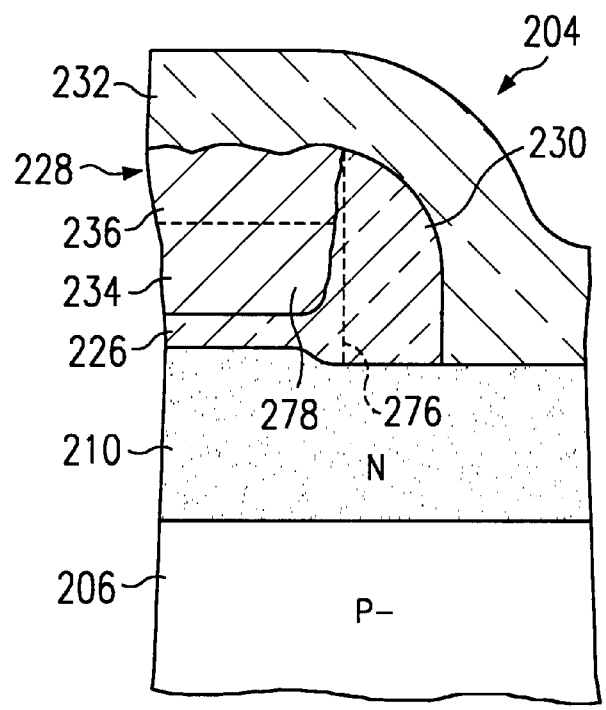
FIG. 6 is a cross section of a portion of an EEPROM memory cell made in accordance with one embodiment of the present invention at a location corresponding to the portion of a prior art EEPROM memory cell shown in FIG. 4, and with certain portions greatly exaggerated out of scale for ease of illustration.

An improved semiconductor device structure is illustrated in FIG. 6 at a location in an EEPROM memory cell made in accordance with a process of the present invention. The structure of FIG. 6 is similar to the portion of the prior art device depicted in FIG. 4, similar numerals designating corresponding parts. FIG. 6 shows that the lower corner 278 of polysilicon layer 234 is more rounded than its prior art counterpart. The rounded corner 278 is also slightly farther removed from the upper surface of underlying N-type region 210. Also, the rounded corner 278 is displaced slightly laterally from the boundary 276 of the sidewall oxide spacer 230. These structural features at the edge of the tunnel oxide layer 226 are produced by a short duration oxidation process which converts some of the silicon of the polysilicon layer 234 and a small amount of the upper surface of the substrate 206 to silicon dioxide so as to significantly improve the dielectric integrity at the lower corner of the silicided polysilicon layer 228.

According to the present invention, however, a technique has been found that enables use of a brief reoxidation step with a tantalum silicide film having a ratio of Si to Ta of about 2.5 to about 2.7, with the preferred ratio being about 2.6. The reoxidation produces a profile schematically represented in FIG. 6. It will be understood that FIG. 6 is not to be considered dimensionally accurate but conveys a visual impression of the benefits of the improved process. The preferred thicknesses of the layers 226, 234, 236 and 232 may be the same as those of the prior art device of FIG. 4 as described above. Only the oxide thickness at the outer edge of the tunnel oxide layer 226 is altered. The reoxidation causes the polysilicon corner 278 to move slightly upward and laterally (to the left in the figure) away from the boundary 276 of the sidewall oxide spacer 230 (which is only partially formed at that stage of the process). At the same time, some of the silicon of the region 210 is converted to silicon dioxide, moving the silicon surface downward slightly and farther away from the polysilicon corner 278. The result is an improved dielectric integrity at the corner 278.

The process improvement is achieved by encapsulating the silicided polysilicon layers by depositing a thin porous oxide at a relatively low temperature following the anisotropic etch step used to pattern the silicided polysilicon layers. Preferably, a porous oxide is deposited to a thickness of about 200 Å to about 500 Å at a temperature of less than 400° C. Then, a brief reoxidation step is performed at a temperature of about 900° C. for a duration sufficient to grow about 200 Å of silicon dioxide on bare silicon monitor wafers with a light surface doping. Such duration for the reoxidation step will grow about 50 Å of oxide on the substrate beneath the porous oxide because the oxygen must first penetrate the porous oxide. Somewhat less $SiO_2$ is grown in the vicinity of the corner 278. The presence of the thin porous oxide layer atop the silicided polysilicon effectively inhibits the reaction of the silicide with oxygen to avoid "whisker" formation, yet enough oxygen penetrates the porous oxide to cause a sufficient silicon dioxide growth at the edges of the polysilicon layer 234 near the corner 278 and on the adjacent surface of substrate region 210 to greatly improve the dielectric integrity of the oxide at the vicinity of the corner 278. The oxide is effectively made thicker at that point by consuming silicon in the oxidation reaction to cause the corner 278 to move upward and the substrate surface therebelow to move downward. The oxidation also plugs any slight gaps that may have been left at the interface 276 following deposition of the porous oxide.

Such a low temperature porous oxide deposition can be performed using conventional equipment and known techniques. The preferred oxide deposition equipment is available from the Watkins-Johnson Company of Scotts Valley, Calif. Due to the wide use of this company's equipment for low temperature oxide deposition, the resulting oxide is sometimes called WJ oxide. In the deposition process, the reaction $SiH_4 + 2O_2 \rightarrow SiO_2 + 2H_2O$ is performed at a temperature between 400° C. and 500° C., preferably at about 430° C.

Figure 1:
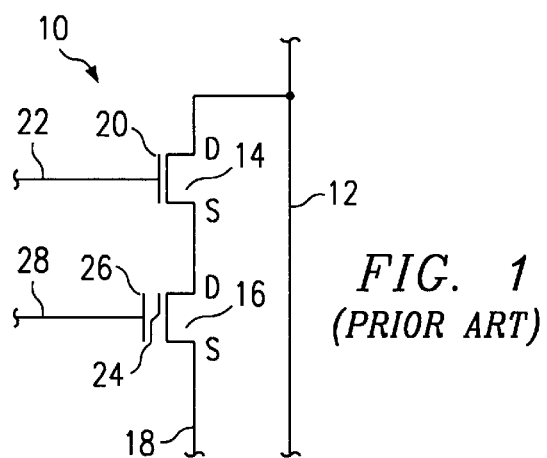
FIG. 1 is a circuit diagram of a prior art EEPROM memory cell.
Figure 3:
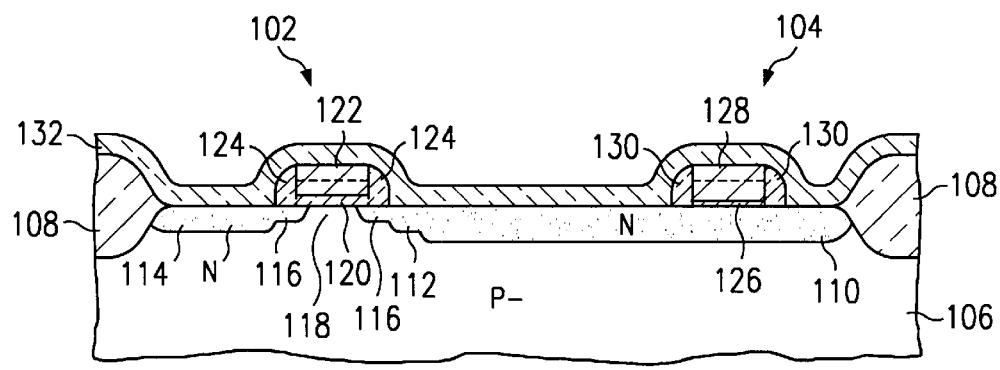
FIG. 3 is a schematic cross section taken along line 3—3 of FIG. 2, with certain portions greatly exaggerated out of scale for ease of illustration.

The low temperature oxide deposition and reoxidation steps are followed by essentially conventional process steps with minor adjustments. In particular, after the reoxidation step, the LDD implant is performed, but at a slightly higher dose and energy to compensate for penetrating the porous oxide layer and the regrown oxide layer on the substrate surface. This produces LDD regions at the transistor sites (like regions 116 at the site of transistor 102 of FIG. 3). The LDD implant merely adds an insignificant amount of doping to the preexisting N-type region 210 of FIG. 6, i.e., the lower plate of tunneling capacitor 204. Then, a spacer oxide layer is deposited to a thickness of about 5000 Å. This deposition step is performed at a relatively high temperature in the range from 700° C. to 775° C., preferably at about 750° C., using TEOS (tetra-ethyl-ortho-silicate) as the source material in accordance with well known techniques. Then, an anisotropic etch is performed to produce the sidewall oxide spacers, such as spacer 230. It will be appreciated that a portion of spacer 230 will be derived from the porous WJ oxide and a portion will be derived from the TEOS oxide. At this point, an implant step is performed to produce source and drain regions (like regions 114 and 112 of transistor 102 shown in FIG. 3). Subsequent standard process steps are performed including steps for forming glass passivation layer 232 as depicted in FIG. 6.

The foregoing process steps produce an oxide layer of increased thickness at the outer edge of the silicided polysilicon layer 228 in the vicinity of the lower corner 278. The oxide thickness between the corner 278 and the underlying substrate region 210 is greater than the nominal thickness of the tunnel oxide layer 226. Also, the growth of oxide at the outer edge of the polysilicon layer 234 provides a good seal against the facing edge of the WJ oxide along the interface 276 therebetween, thus improving the dielectric integrity at the periphery of the tunnel oxide layer 226. The use of the porous deposited oxide prior to reoxidation protects the tantalum silicide 236 from exposure to the oxidizing ambient sufficiently to prevent excessive reaction with the silicon in the tantalum silicide layer so as to avoid the "whisker" phenomenon. The net result is a structure having a reduced electric field concentration at the corner 278 and a thicker, short-circuit-resistant oxide beneath the corner.

Figure 2:
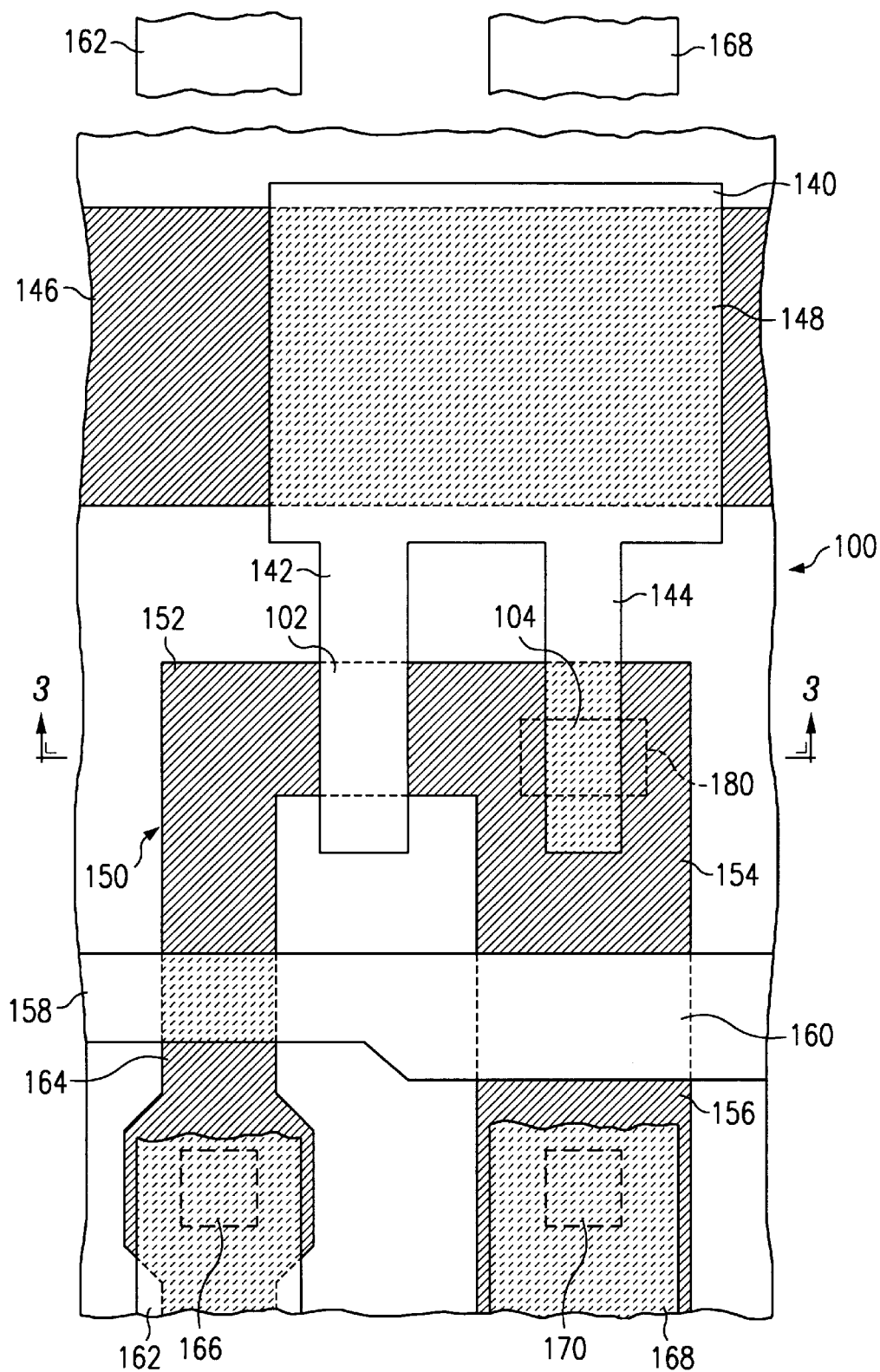
FIG. 2 is a schematic plan view depicting the layout of an EEPROM memory cell of the prior art with doped regions shaded by full hatching where uncovered and dashed hatching where covered by a conductive layer in the figure.
Figure 5:
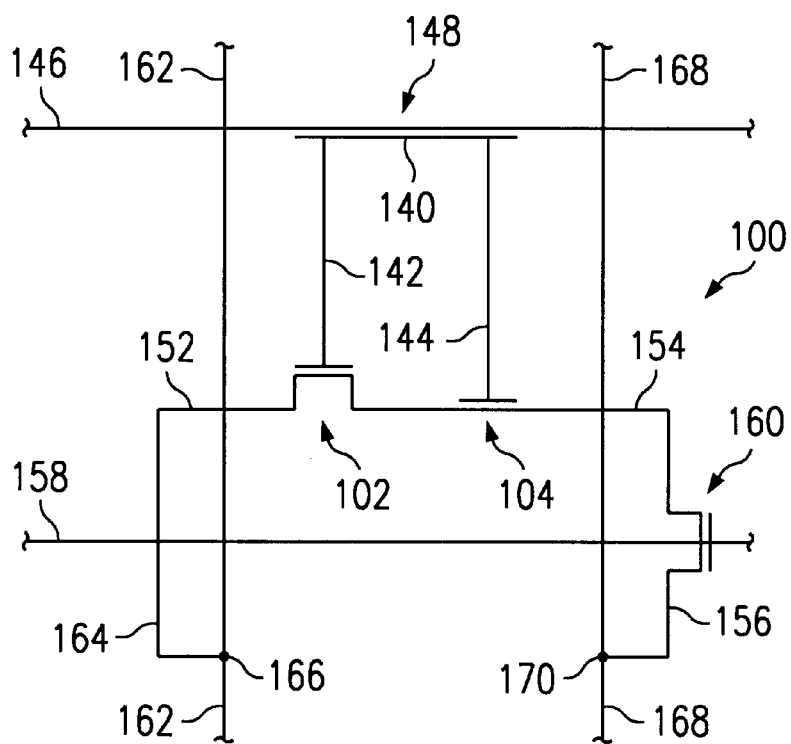
FIG. 5 is a schematic circuit diagram of the EEPROM memory cell of FIG. 2.
Figure 7:
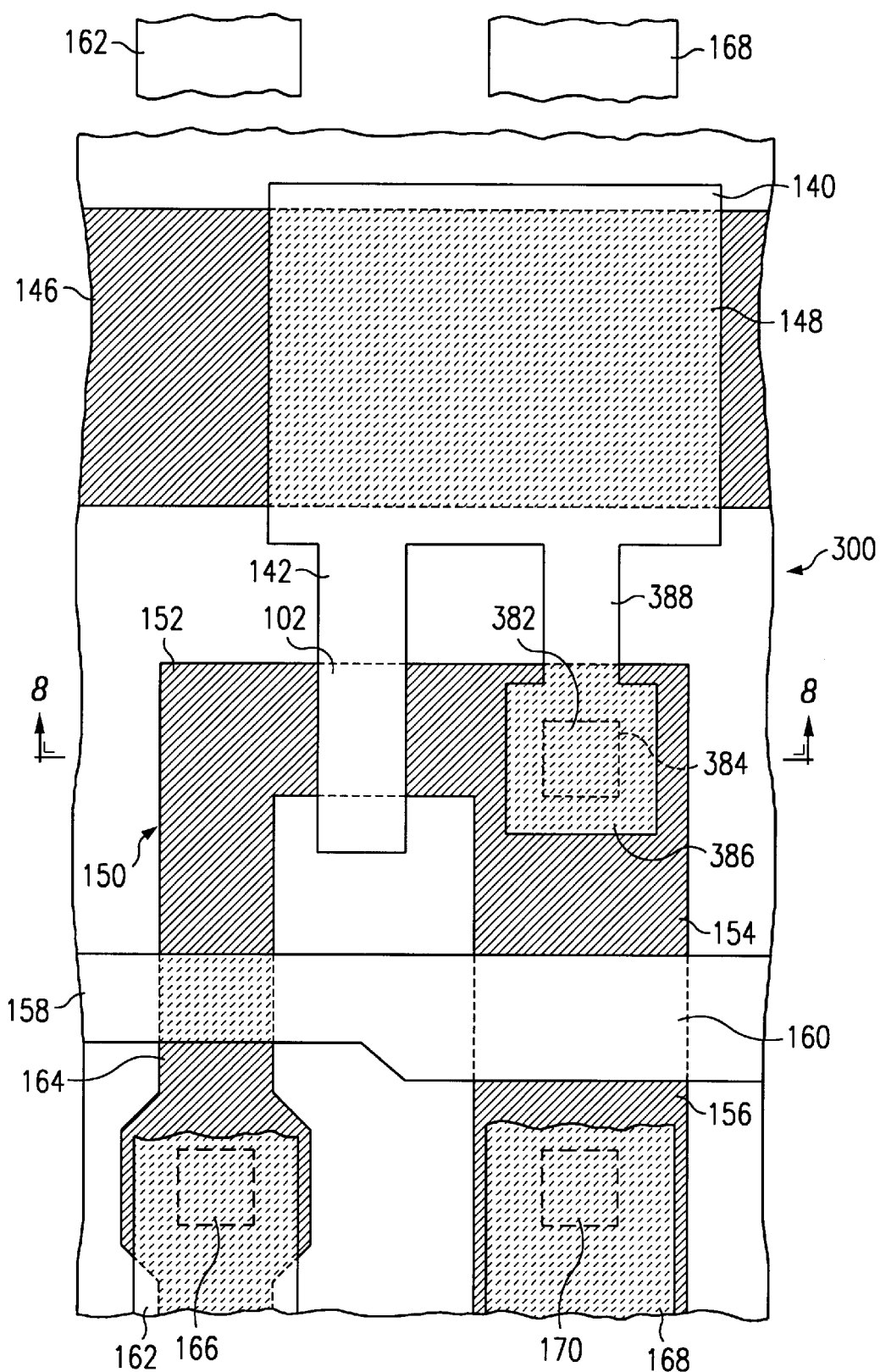
FIG. 7 is a schematic plan view of a layout of an EEPROM memory cell in accordance with another embodiment of the present invention.

In accordance with another embodiment of the present invention, an alternative layout for the EEPROM memory cell of FIG. 2 is shown in FIG. 7 and indicated generally by reference numeral 300. Since the only change is in the structure of the tunneling capacitor, the same reference numerals are used to designate parts that are unaffected by the change. The operation of memory cell 300 is the same as described above for memory cell 100.

The memory cell 300 of FIG. 7 has a tunneling capacitor 382 with a substantially square tunnel oxide layer depicted as the dashed box 384. An upper capacitor plate 386 overlies the tunnel oxide layer 384 and extends laterally beyond the tunnel oxide layer 384 on all four sides. The upper capacitor plate 386 is preferably square and symmetrically disposed relative to the tunnel oxide layer 384. The upper capacitor plate 386 is connected to the relatively large rectangular portion 140 by a strip 388. The large portion 140, finger extension 142, strip 388 and square plate 386 comprise parts of a unitary silicided polysilicon layer that also serves as the upper capacitor plate of biasing capacitor 148 and the floating gate of floating-gate transistor 102. Preferably, the area of the tunnel oxide layer 384 is about 1.5 square microns.

Figure 8:
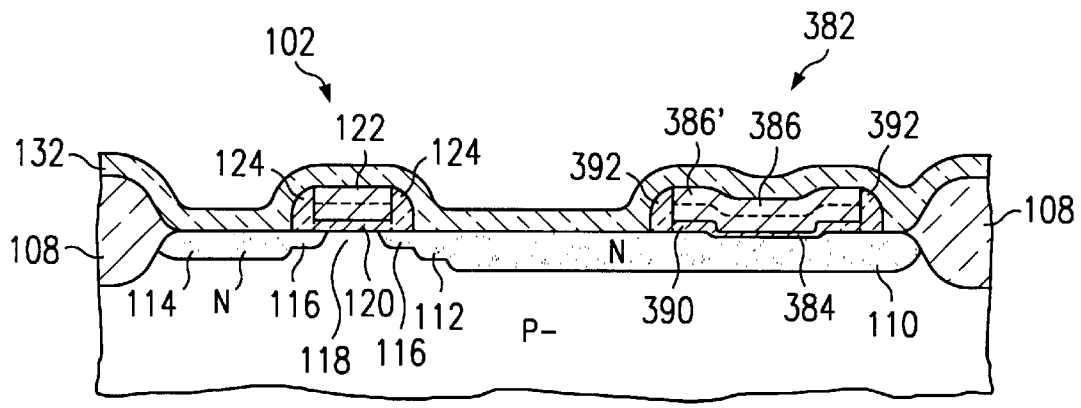
FIG. 8 is a schematic cross section taken along line 8—8 of FIG. 7, with certain portions greatly exaggerated out of scale for ease of illustration.

Referring to FIG. 8, a cross section through the tunneling capacitor 382 shows the stepped profile of the upper capacitor plate 386. The tunnel oxide layer 384 is surrounded by an annular oxide shelf 390, which is derived from the same thin oxide layer that forms the gate oxide 120 of the floating-gate transistor 102. The upper capacitor plate 386 includes a peripheral shoulder 386' overlying the thin oxide shelf 390. Sidewall oxide spacers 392 are formed at the edges of the tunneling capacitor 382 in the process steps that form sidewall oxide spacers 124 at the edges of gate structure of floating-gate transistor 102.

Figure 9:
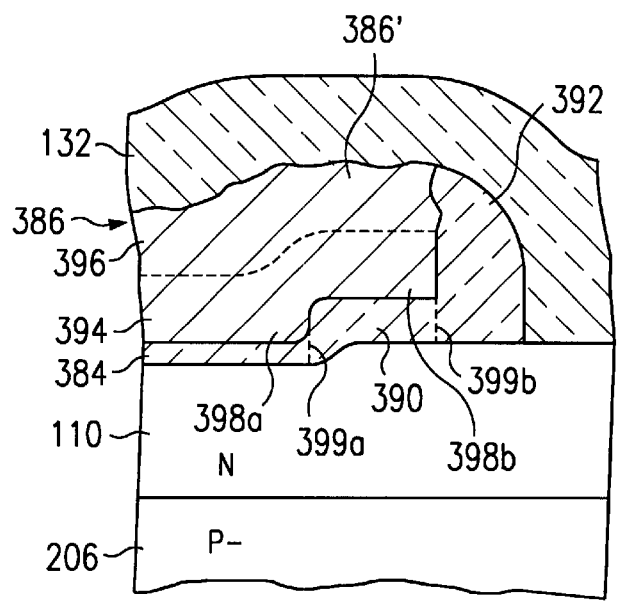
FIG. 9 is an enlarged view of a portion of the structure shown in FIG. 8.

Referring to the enlarged view of FIG. 9, the upper capacitor plate 386 includes a lower N-type doped polysilicon layer 394 and an upper tantalum silicide layer 396. The lower surface of the polysilicon layer 394 has an inner corner 398a and an outer corner 398b. A first oxide interface 399a lies below inner corner 398a, and a second oxide interface 399b lies below outer corner 398b.

Figure 4:
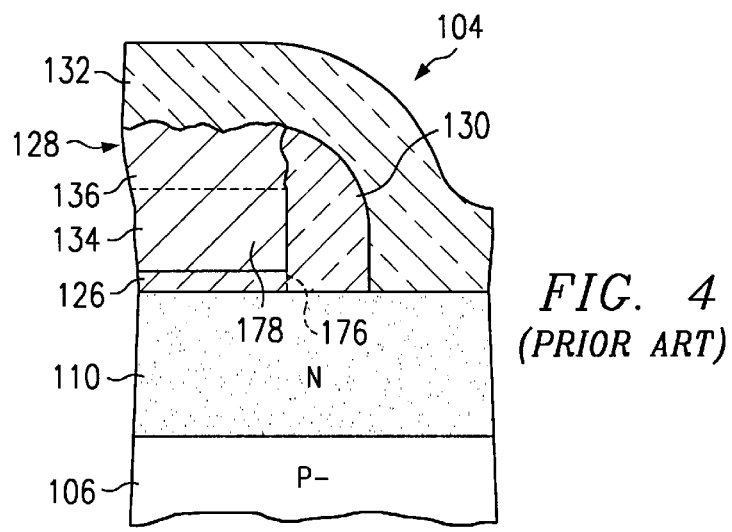
FIG. 4 is an enlarged view of a portion of the structure shown in FIG. 3.

It will be appreciated that the second oxide interface 399b is approximately four times taller than the oxide interface 176 of the prior art device shown in FIG. 4 (i.e., oxide shelf 390 is about 260 Å thick and tunnel oxide layer 126 is only about 65 Å to 70 Å thick). Thus, the dielectric integrity at the outer corner 398b in the device of FIG. 9 is significantly superior than at the corner 178 in the prior art device of FIG. 4. A reoxidation procedure through a porous oxide layer as described above in connection with FIG. 6 could be added to further improve the dielectric integrity at the corner 398b of the device of FIG. 9, but such additional procedure is not necessary if good control is maintained for the TEOS deposition used to form sidewall oxide spacers 392.

It will also be appreciated that the first oxide interface 399a has a superior dielectric integrity compared to the oxide interface 176 of the prior art device shown in FIG. 4. Such is the case because tunnel oxide layer 384 is grown within the window formed by the annular oxide shelf 390 so the edge of oxide layer 384 grows up against the inner wall of the shelf 390 at the interface 399a. On the other hand, the edge of tunnel oxide layer 126 is formed by an etching step, and the oxide used to form spacer 130 is deposited to define the interface 176 in the prior art device of FIG. 4. Therefore, the sealing effect of growing oxide layer 384 up against the inner wall of oxide shelf 390 provides a superior dielectric integrity at the vulnerable interface 399a.

Figure 10:
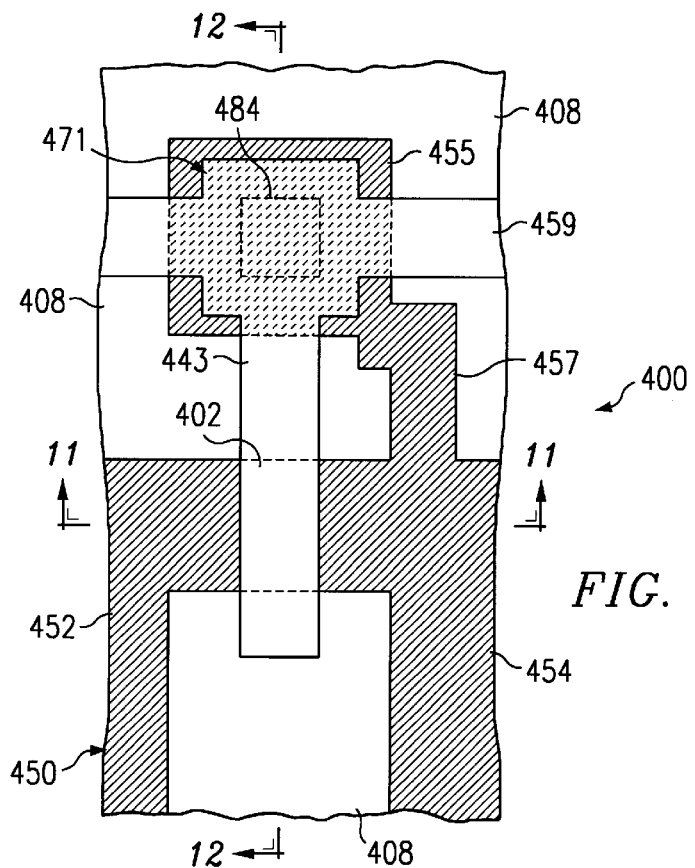
FIG. 10 is a schematic plan view of a layout of an EEPROM memory cell in accordance with another embodiment of the present invention.
Figure 11:
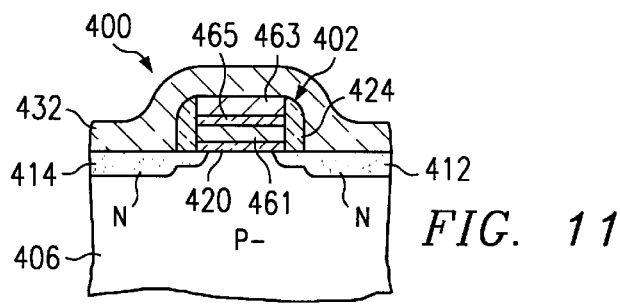
FIG. 11 is a schematic cross section taken along line 11—11 of FIG. 10, with certain portions greatly exaggerated out of scale for ease of illustration.
Figure 12:
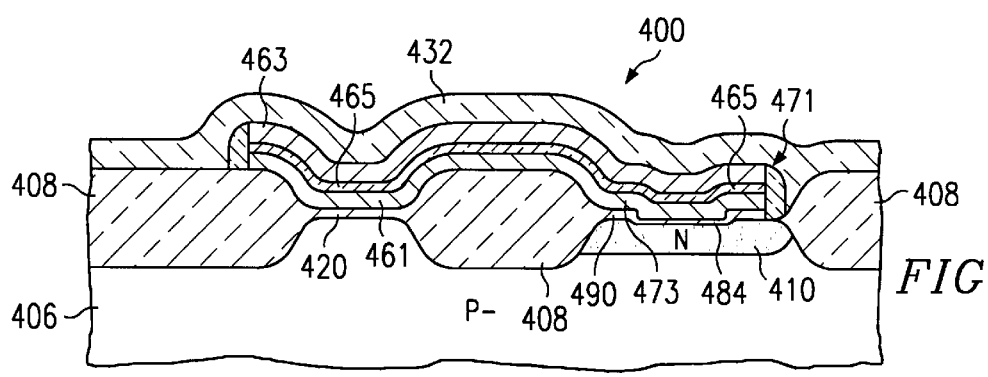
FIG. 12 is a schematic cross section taken along line 12—12 of FIG. 10, with certain portions greatly exaggerated out of scale for ease of illustration.

In accordance with another embodiment of the present invention, an EEPROM memory cell with a stacked gate arrangement is shown in FIGS. 10–12 and indicated generally by reference numeral 400. With particular reference to FIG. 10, a floating-gate transistor 402 is defined where a double-poly, stacked-gate layer 443 extends across an active area 450 that includes separate N-type regions 452 and 454. The active area 450 is defined between portions of a thick field oxide 408. A tunneling capacitor 471 is formed in a square region 455 defined by the field oxide 408. The region 455 is doped N-type and is connected to transistor region 454 by an N-type passageway 457. An extension 459 of the stacked-gate layer 443 runs through the memory array to provide a program line to memory cells (not shown) in the same row. The program line extension 459 preferably includes only the second conductive level of the stacked-gate conductors.

Additional structural features of the memory cell 400 will now be described with reference to the cross sectional views of FIG. 11 and FIG. 12. The floating-gate transistor 402 comprises a floating gate 461 of polysilicon formed above a gate oxide layer 420. A silicided polysilicon control gate 463 is formed in a stacked arrangement above the floating gate 461 separated by an intermediate composite dielectric layer 465, which preferably consists of an oxide-nitride-oxide ("ONO") layer of about 200 Å in thickness. Layer 465 is conventionally formed by depositing about 100 Å of silicon dioxide followed by depositing about 100 Å of silicon nitride, and then exposing the device to an oxidizing ambient to oxidize about the top 10 Å of the nitride layer. The silicided polysilicon layer 463 preferably comprises a lower N-type polysilicon layer and an upper tantalum silicide layer (which are not separately delineated in the figures). The floating gate transistor 402 also includes a drain region 412 and a source region 414 with conventional LDD extensions defining a channel beneath the stacked gates. Conventional sidewall oxide spacers 424 are also included. A conventional thick glass passivation layer 432 covers the structure. Thickness dimensions for the various layers are similar to those described above for similar layers. The floating gate 461 is preferably N-type polysilicon, which is about 2000 Å thick.

With particular reference to FIG. 12, the active area portions of the substrate 406 are shown defined by the thick field oxide 408. The right hand portion of the structure of FIG. 12 defines the site of the tunneling capacitor 471, which includes an N-type region 410, an ultrathin tunnel oxide layer 484, a surrounding thin oxide shelf 490, and a portion 473 of the first-level polysilicon layer that also defines the floating gate 461 of the floating-gate transistor 402. The ultrathin tunnel oxide layer 484 is preferably grown to a thickness of 65 Å to 70 Å in a window cut through a thin oxide shelf 490 that corresponds to the gate oxide 420 of the floating-gate transistor. The thin oxide shelf 490 is preferably about 260 521 thick and completely surrounds the ultrathin tunnel oxide layer 484. The ONO layer 465 is preferably about 200 Å thick, but can be adjusted in thickness to establish the desired capacitance of the biasing capacitor defined by conductive layers 461 and 463, with ONO layer 465 serving as the capacitor dielectric.

The memory cell 400 also includes a select transistor (not shown) arranged in series with the floating-gate transistor 402 in a manner similar to select transistors 14 and 160 of the previously described memory cells. Thus, those skilled in the art will appreciate that the double-poly memory cell 400 may be programmed and operated in a manner similar to the single-poly memory cells 100 and 300 discussed above. However, the memory cell 400 can be implemented in a denser layout than memory cells 100 and 300.

Although preferred embodiments of the present invention are described herein, it will be appreciated by those skilled in the art that various changes and substitutions may be made without departing from the spirit and scope of the present invention as set forth in the appended claims.

What is claimed is:

1. An EEPROM memory cell comprising:
a floating-gate transistor and a tunneling capacitor, the floating-gate transistor having LDD extensions defining a channel and having a floating gate disposed on a gate oxide above the channel, the gate oxide having a uniform thickness above the channel, the floating gate forming a first plate of the tunneling capacitor, the tunneling capacitor having a second plate and a first dielectric layer separating the first and second plates, the first dielectric layer permitting electrons to tunnel therethrough in response to a predetermined bias applied to the first plate relative to the second plate, the tunneling capacitor further having a second dielectric layer completely surrounding and abutting the first dielectric layer to form an annular shelf that is thicker than the first dielectric layer, the first plate completely overlying the first dielectric layer and overlying the annular shelf adjacent to and around all sides of the first dielectric layer, the first plate and the annular shelf having aligned peripheral edges around all sides thereof, and further comprising sidewall oxide spacers including first portions abutting the aligned peripheral edges entirely along all sides thereof, and second portions abutting the floating gate above the LDD extensions, wherein the gate oxide of the floating-gate transistor is distinct and separated from the annular shelf of the second dielectric layer of the tunneling capacitor.

2. The EEPROM memory cell of claim 1 wherein the first plate of the tunneling capacitor comprises a silicided polysilicon layer, and further comprising a biasing capacitor in which the first plate of the tunneling capacitor is shared as a common plate, and in which an N-type substrate region forms a second capacitor plate of the biasing capacitor and serves as a control gate of the floating-gate transistor.

3. The EEPROM memory cell of claim 2 wherein the annular shelf of the second dielectric layer has a thickness that is about four times the thickness of the first dielectric layer.

4. An integrated circuit device having a plurality of EEPROM memory cells formed on a semiconductor substrate, each memory cell comprising:

an active area defined in the substrate within a thick field oxide layer:

a floating-gate transistor disposed on the substrate and having a floating gate and a control gate, the floating-gate transistor including source and drain regions having LDD extensions defining a channel therebetween in the substrate, the floating-gate transistor further including a gate oxide of uniform thickness disposed above the channel;

a tunneling capacitor disposed on the substrate over a portion of an N-type region that defines a substrate capacitor plate within the active area, the tunneling capacitor having an ultrathin tunnel oxide layer confined entirely within a surrounding thin oxide shelf that is thicker than the ultrathin tunnel oxide layer, the thin oxide shelf having inner edges that abut the ultrathin tunnel oxide layer and peripheral edges that overlie the N-type region, the thin oxide shelf having the same thickness as the gate oxide of the floating-gate transistor;

sidewall oxide spacers including first portions abutting each of the peripheral edges of the thin oxide shelf and second portions abutting the floating gate above the LDD extensions; and a biasing capacitor connected in series with the tunneling capacitor;

wherein the floating gate of the floating-gate transistor forms a common capacitor plate of the tunneling capacitor and the biasing capacitor, the common capacitor plate lying atop the ultrathin tunnel oxide layer and atop adjacent portions of the surrounding thin oxide shelf, such that the common capacitor plate completely covers the ultrathin tunnel oxide layer and overlies the thin oxide shelf on all sides of the ultrathin tunnel oxide layer;

and wherein the thin oxide shelf is confined by the first sidewall oxide spacer portions and a portion of the thick field oxide layer to an area entirely over the N-type region that defines the substrate capacitor plate.

5. The device of claim 4 wherein the biasing capacitor has a second capacitor plate defined by another N-type region of the substrate that also serves as the control gate of the floating-gate transistor.

6. The device of claim 5 wherein the thin oxide shelf has a thickness that is about four times the thickness of the ultrathin tunnel oxide layer.

7. The device of claim 4 wherein the common capacitor plate comprises a portion of a polysilicon layer at a first conductive level above the substrate, and further comprising a silicided polysilicon layer at a second conductive level above the substrate, the silicided polysilicon layer having a portion defining a second capacitor plate of the biasing capacitor that also serves as the control gate of the floating-gate transistor.

8. The device of claim 8 wherein the thin oxide shelf has a thickness that is about four times the thickness of the ultrathin tunnel oxide layer.

9. The device of claim 4 wherein the ultrathin tunnel oxide layer is substantially square in shape.

10. The device of claim 9 wherein the ultrathin tunnel oxide layer occupies an area of about 1.5 square microns.

* * * * *